US009385707B2

(12) United States Patent
Lee (10) Patent No.: US 9,385,707 B2
(45) Date of Patent: Jul. 5, 2016

(54) MULTI-GATE HIGH VOLTAGE DEVICE (71) Applicant: Taiwan Semiconductor Manufacturing Company, Ltd., Hsin-Chu (TW)

(72) Inventor: Jam-Wem Lee, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/599,942

(22) Filed: Jan. 19, 2015

(65) Prior Publication Data

US 2015/0130515 A1 May 14, 2015

Related U.S. Application Data (62) Division of application No. 13/920,913, filed on Jun. 18, 2013, now Pat. No. 8,937,364.

(60) Provisional application No. 61/747,152, filed on Dec. 28, 2012.

(51) Int. Cl.
*H01L 29/02* (2006.01)
*H03K 17/687* (2006.01)
*H01L 29/78* (2006.01)
*H01L 27/02* (2006.01)
*H01L 27/088* (2006.01)
*H01L 29/06* (2006.01)

(52) U.S. Cl.
CPC .......... *H03K 17/687* (2013.01); *H01L 27/0207* (2013.01); *H01L 27/088* (2013.01); *H01L 29/7831* (2013.01); *H01L 29/0653* (2013.01); *H01L 29/7816* (2013.01); *H03K 2017/6878* (2013.01)

(58) Field of Classification Search
CPC ...................................... H03K 17/687
USPC ........................................... 257/487
See application file for complete search history.

(56) References Cited

U.S. PATENT DOCUMENTS

2011/0148337 A1 6/2011 Yamada

*Primary Examiner* — Anthony Ho
(74) *Attorney, Agent, or Firm* — Slater Matsil, LLP (57) ABSTRACT A high voltage semiconductor device, particularly a device including a number of high breakdown voltage transistors having a common drain, first well, and insulating structure between the gate and the drain as well as method for using the same is provided in this disclosure. The high breakdown voltage transistors in the device together are in an elliptical shape. A second well region, gate structure, and a source region are partially overlapping discontinuous elliptical rings having at least two discontinuities or openings in a top view. The respective discontinuities or openings define each of the high breakdown voltage transistors.

20 Claims, 6 Drawing Sheets

MULTI-GATE HIGH VOLTAGE DEVICE

PRIORITY CLAIM

This application is a divisional of U.S. patent application Ser. No. 13/920,913, filed on Jun. 18, 2013, and entitled "Multi-Gates High Voltage Device," which claims the benefit of priority to U.S. Provisional Patent Application No. 61/747,152, filed on Dec. 28, 2012, and entitled "Multi-Gate High Voltage Device," which applications are hereby incorporated herein by reference.

FIELD

The present disclosure relates generally to semiconductor technology, and more particularly, to high voltage semiconductor devices and methods of making the same.

BACKGROUND

Technological advances in semiconductor integrated circuit (IC) materials, design, processing, and manufacturing have enabled ever-shrinking IC devices, where each generation has smaller and more complex circuits than the previous generation.

As semiconductor circuits composed of devices such as metal-oxide-semiconductor field effect transistors (MOSFETs) are adapted for high voltage applications, problems arise with respect to decreasing voltage performance as the scaling continues with advanced technologies. To maintain high breakdown voltage, large circular transistor designs are used to insulate the transistor drain with a large insulating structure between drain and gate.

With the circular transistor design, the breakdown voltage dictates the size of the transistor. Shrinking the circular transistor using present manufacturing materials and processes is challenging. The circular transistors may be inefficient because the rated driving current for a size to meet the breakdown voltage specification is often much larger than the driving current specification. To reduce the current output, resistors are added in the circuit. The circular transistor is also hard to control, as the threshold voltage often vacillates in a range. A complex control circuit is often used in conjunction with a circular transistor. Thus, a high voltage transistor device having an efficient and scalable design structure while maintaining a high breakdown voltage threshold and a method for making the same in a cost effective manner continues to be sought.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

Various embodiments of the present invention will be explained in detail with reference to the accompanying drawings.

DETAILED DESCRIPTION

The present disclosure relates to high breakdown voltage transistors in a device and a method for fabricating and using such devices. It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Spatially relative terms, such as "beneath," "below," "lower," "above," "upper", "over" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may likewise be interpreted accordingly.

Figure 1:
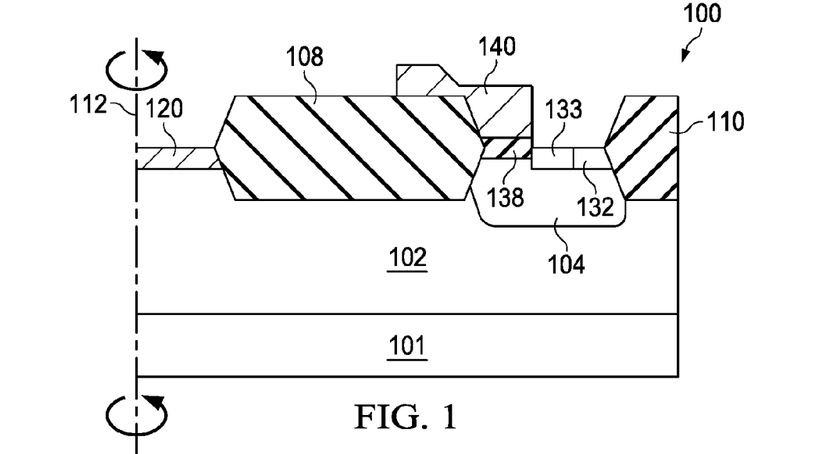
FIG. 1 is a cross-sectional diagram of a high breakdown voltage device in accordance with various embodiments of the present disclosure.
Figure 2:
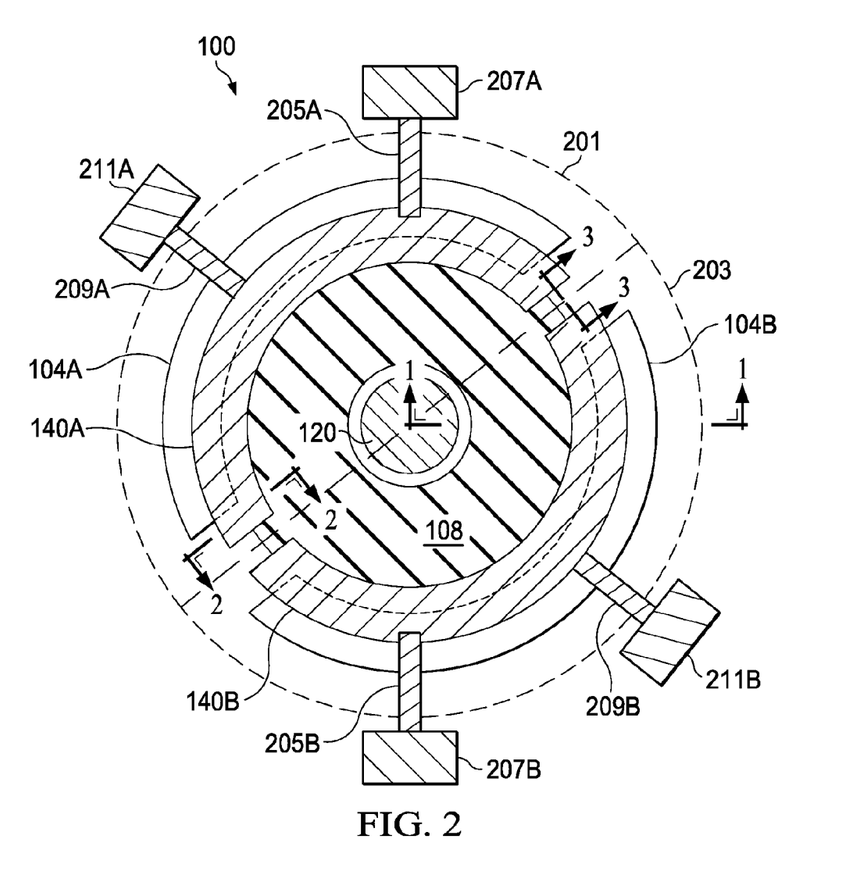
FIG. 2 is a top view of a high breakdown voltage device according to various embodiments of the present disclosure.
Figure 3:
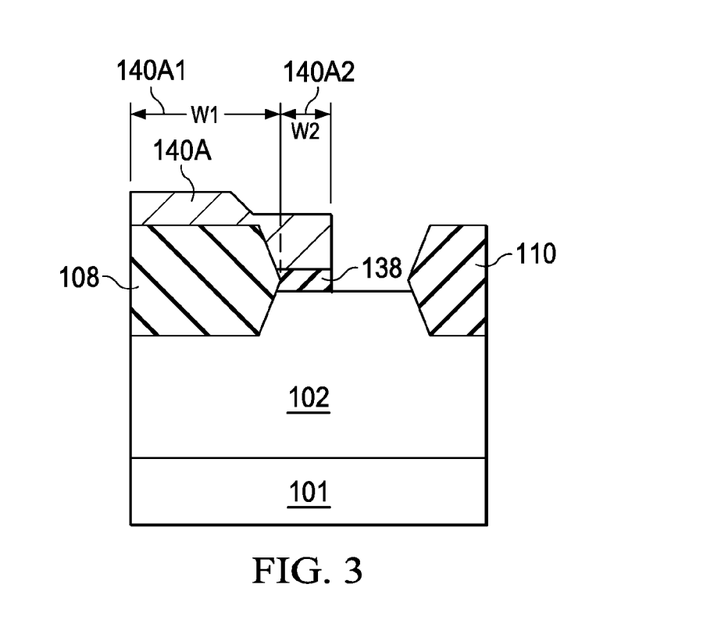
FIGS. 3 and 4 are sectional views of a high breakdown voltage device according to various embodiments of the present disclosure.
Figure 4:
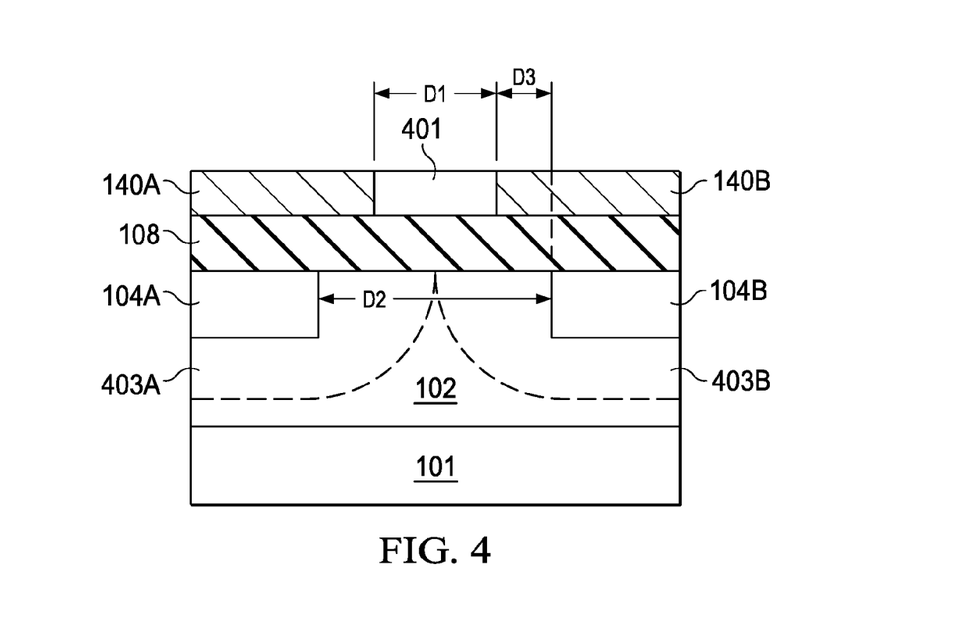

FIG. 1 is a cross-sectional view of a portion of a high breakdown voltage device in accordance with various embodiments of the present disclosure. In this cross-section view, the high breakdown voltage device is similar to conventional high breakdown voltage transistors. However, in other views as shown in FIGS. 2-4, the novel differences are highlighted. In FIG. 1, an n-type high breakdown voltage device 100 is fabricated in and on a p-substrate 101. A deep n-well 102 is formed in the substrate 101. A first insulating structure 108 is formed over and partially embedded in the n-well 102. A gate 140 is partly overlying the first insulating structure 108. The portion of the gate 140 not overlying the first insulating structure 108 is overlying the gate dielectric 138. A source and a drain are formed on opposite sides of the gate

140. The source includes a pair of oppositely doped regions p+ (132) and n+ (133) contained in a p-well 104. Source terminal (not shown) is electrically connected to the source regions 132 and 133. A second insulating structure 110 is disposed at the end of the p-well 104 opposite from the first insulating structure 108. At the edge of first insulating structure 108 opposite from gate 140, n+ doped drain region 120 is formed in n-well 102 and electrically connected to a drain terminal (not shown). In some embodiments, a p-top region, a p-type doped floating layer not connected to the source of the drain region, is formed in the deep n-well 102 under the first insulating structure 108 and may or may not contact the first insulating structure 108.

In a conventional high breakdown voltage transistor, the cross section of FIG. 1 is rotated 360 degrees about an axis 112 to form a circular type high breakdown voltage transistor. In a circular type high breakdown voltage transistor, first insulating structure 108, the gate 140, the gate dielectric 138, the p-well 104, the source doped regions 132/133, and the second insulating structure 110 are all ring shaped. The drain 120 and deep n-well 102 are circles. Other conventional high breakdown voltage transistors include a non-circular design incorporating curves. The drain region may be an ellipse, with first insulating structure 108, the gate 140, the gate dielectric 138, the p-well 104, the source doped regions 132/133, and the second insulating structure 110 being elliptical rings. In another example, the high breakdown voltage transistor has a U-shape with the center of the U-shape being the drain.

The present disclosure discloses a high breakdown voltage transistor that has good breakdown voltage, is scalable, and is more efficient than the conventional circular high breakdown voltage transistor. The high breakdown voltage transistor of the present disclosure is a pie-slice having the cross-sectional view of FIG. 1 without rotating 360 degrees about the axis of rotation 112. A number of the high breakdown voltage transistors of the present disclosure is disposed next to each other to form an elliptical shape, which may be circular. The high breakdown voltage transistors within an elliptical shape share a drain region and have first insulating structures and deep n-wells that are connected to each other. Each of the high breakdown voltage transistors has its own gate, source region, and p-well. The device may be formed using the same processes as the conventional high breakdown voltage transistor with different photomasks defining the separate gates, source regions, and p-wells.

According to various embodiments, one elliptical shape is divided into a number of high breakdown voltage transistors. Together, the high breakdown voltage transistors can drive a current substantially equal to that of a conventional circular high breakdown voltage transistor formed in the same area. Separately, each high breakdown voltage transistor can drive a current corresponding to an area portion of the total area. By turning on one or more of the high breakdown voltage transistors, a desired current may be driven by the device. In this scenario, the driving current of the device may be adjusted by selecting a subset of the high breakdown voltage transistors to turn on. The ability to adjust the driving current reduces or eliminate the need to have resistors, further reducing the area requirement of the device.

One or more of the high breakdown voltage transistors may be turned on at any time. In some embodiments, the high breakdown voltage transistors may be used sequentially to improve the reliability of the device. As performance of one high breakdown voltage transistor deteriorates past a certain threshold, a new high breakdown voltage transistor may be substituted in the circuit to maintain a high performance and reliability of the circuit. For example, a current meter may monitor the performance of the high breakdown voltage transistors when turned on, when an on-current deviates from the expected value by a certain amount, an alternate high breakdown voltage transistor or a combination of high breakdown voltage transistors are selected instead to provide the on-current. In another example, if the on-current decreases by a certain amount, a high breakdown voltage transistor may be turned on to provide the additional current.

FIG. 2 is a top view of a semiconductor device 100 according to various embodiments of the present disclosure. The device 100 of FIG. 2 includes two high breakdown voltage transistors 201 and 203 sharing a drain region 120. The sectional line 1-1 corresponds to the cross section of FIG. 1 and same reference numbers are used as FIG. 1 where applicable. As shown, the structure of cross-section of FIG. 1 does not rotate 360 degrees about the rotating axis in the center of the drain region 120. Around the drain region 120 is the first insulating structure 108 in an elliptical ring shape. The first insulating structure 108 of the high breakdown voltage transistors 201 and 203 are connected. The drain region 120 and the first insulating structure 108 share a center. However, the high breakdown voltage transistors 201 and 203 have separate gate structures 140A and 140B, separate p-wells 104A and 104B, separate gate contact and pads (205A/207A, 205B/207B), and separate source contact and pads (209A/211A, 209B/211B), respectively. The gate structure 140A/140B is in an elliptical ring shape having two openings at ends of the high breakdown voltage transistors 201 and 203. The gate structure openings have a length D1 as shown in FIG. 4. The p-wells 104A/104B are also in an elliptical ring shape embedded in the deep n-well 102. The elliptical ring shaped p-well has two discontinuities at ends of the high breakdown voltage transistors 201 and 203, matching the congruent gate structure openings. The p-well discontinuities have a length D2 as shown in FIG. 4. The length D2 is larger than the length D1. In addition to the gate structures 140A/140B and p-wells 104A/104B, the source regions for high breakdown voltage transistors 201 and 203 are also discontinuous and having congruent discontinuities. The gate structure openings, p-well discontinuities, and source region discontinuities at a same boundary of the high breakdown voltage transistors are said to be congruent.

FIG. 3 is a cross-sectional view of a portion of the semiconductor device 100 of FIG. 2 from section line 2-2 in accordance with various embodiments of the present disclosure. Section line 3-3 radially crosses a p-well discontinuity but not the gate structure opening between high breakdown voltage transistors 201 and 203. In the cross sectional view, the deep n-well 102 is disposed on the substrate 101. A first insulating structure 108 is disposed over a portion of the deep n-well 102. A portion of the first insulating structure 108 is embedded in the deep n-well 102. A gate structure 140A is disposed partially over the first insulating structure 108 and labeled as 140A1. A portion of the gate structure 140A is not disposed over the first insulating structure 108 and labeled as 140A2. The gate structure portion 140A2 includes a gate dielectric 138 between the gate and the deep n-well 102. The gate structure portion 140A1 is sometimes referred to as a field plate portion. The field plate portion has a width W1. The width W2 of the gate structure portion 140A2 is a channel length. Compared to cross section of FIG. 1 in view 1-1, the cross section of FIG. 3 in view 2-2 does not include the p-well 104 and source doped regions 132 and 132.

FIG. 4 is a cross-sectional view of a portion of the semiconductor device 100 of FIG. 2 from section line 3-3 in accordance with various embodiments of the present disclosure. Section line 3-3 located circumferentially at the edge of the first insulating layer and regards toward the center of the semiconductor device 100 through the gate structure opening and the discontinuities between the high breakdown voltage transistors 201 and 203. The cross section of FIG. 4 includes a deep n-well 102 over the substrate 101. P-wells 104A and 104B are located in the deep n-well 102 with a discontinuity between them having a length D2. A continuous first insulating structure 108 overlays the p-wells 104A and 104B and deep n-well 102. Gate structures 140A and 140B are disposed over the first insulating structure 108. The gate structures 140A and 140B have an opening 401 between them. The opening 401 has a length D1. According to various embodiments, D1 is between about 0.2 microns and about 2 microns. As shown, the discontinuity length D2 is larger than the opening length D1. A portion of the gate structure overhangs the p-well discontinuity. The overhang has a length D3. In most embodiments, the gate structure opening and the p-well discontinuity are centered over one another such that the overhang D3 for the high breakdown voltage transistors 201 and 203 are the same. According to various embodiments, the overhang length D3 is larger than the field plate width W1. In other embodiments, the overhang lengths D3 for different high breakdown voltage transistors in the same circular area are not the same. The overhang length D3 and the field plate width W1 is related to the breakdown voltage for the high breakdown voltage transistor. Thus, high breakdown voltage transistors having different breakdown voltages may be formed in the same circular area. Dashed lines denote the boundary for depletion regions 403A and 403B, associated with high breakdown voltage transistors 201 and 203, respectively. As shown, the depletion regions 403A and 403B are separate. In some embodiments, the depletion regions 403A and 403B are merged at the edges.

The separation between p-wells 104A and 104B is dependent on the deep n-well doping. A higher dopant concentration in the deep n-well means that the p-wells 104A and 104B may be closer together without the high breakdown voltage transistors interfering with each other. According to various embodiments, the p-well discontinuity is one micron or more, between about 3 microns to about 12 microns, or between about one micron to about 40 microns. In one example with low doping at about 1E12/cm3, the p-well discontinuity length D2 may be about 40 microns. Such large discontinuity reduces the maximum amount of the driving current from the semiconductor device as compared to a single transistor device. In another example with high doping at 1E15, the p-well discontinuity length D2 may be about one micron. A smaller D2 allows more high breakdown voltage transistors to be formed in the same circular area for the semiconductor device.

According to various embodiments, the discontinuity lengths for the p-well and for the source region are about the same. Generally, the discontinuity length for the source region is the same or larger than the discontinuity length for the p-well region because the source region is formed within the p-well region.

Figure 5:
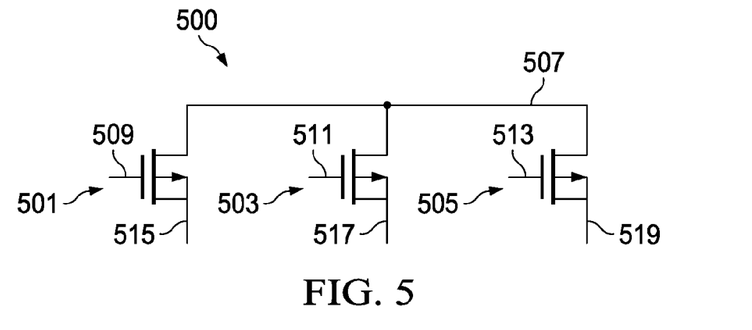
FIG. 5 is an electrical diagram of a circuit of a high breakdown voltage device according to some embodiments of the present disclosure.

FIG. 5 is an electrical circuit diagram of a high breakdown voltage device 500 according to some embodiments of the present disclosure. The circuit of FIG. 5 includes three high breakdown voltage transistors 501, 503, and 505 with a common drain 507. The gates 509, 511, and 513 of the high breakdown voltage transistors 501, 503, and 505 may be turned on separately or together to drive a current through the device. Each of the high breakdown voltage transistors 501, 503, and 505 may have a different rated driving current. For example, assume that the high breakdown voltage transistor 501 has a driving current A, and high breakdown voltage transistor 503 has a driving current B, and high breakdown voltage transistor 505 has a driving current C. For example, a current A+B may be driven through the device 500 by turning on high breakdown voltage transistors 501 and 503. In another example, a current A+B+C may be driven through the device 500 by turning on high breakdown voltage transistors 501, 503, and 505. Any sum combination of the driving currents A, B, and C may be driven through the circuit 500 by separately controlling the gates 509, 511, and 513. The embodiment of FIG. 5 shows three high breakdown voltage transistors and the embodiment of FIG. 2 shows two high breakdown voltage transistors. The various embodiments of the present disclosure includes embodiments of any number of high breakdown voltage transistors in the same circular area in a high breakdown voltage device.

Figure 6:
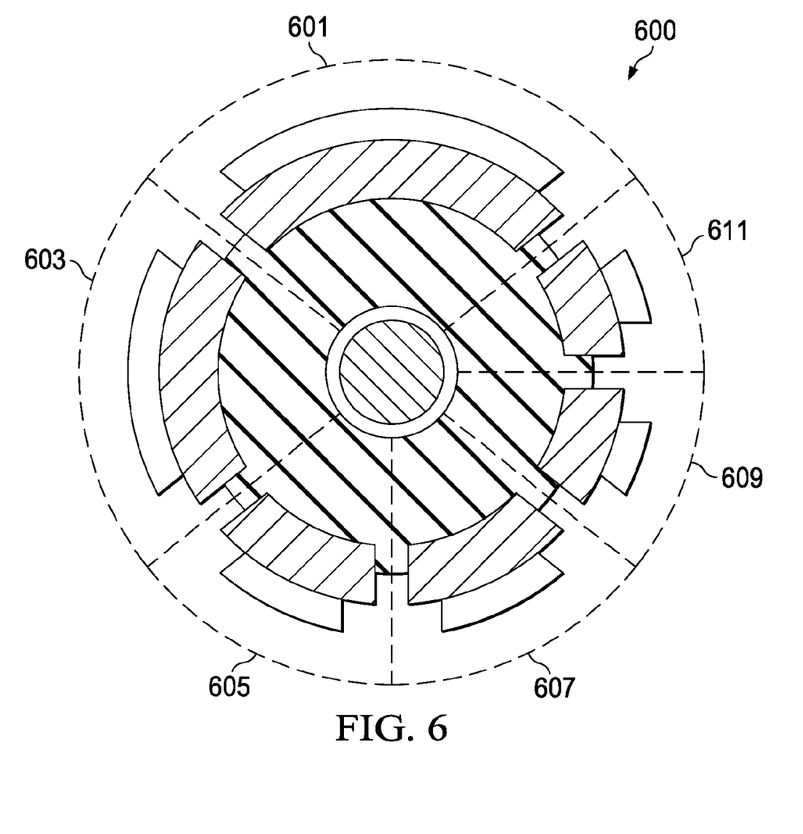
FIGS. 6 and 7 are top views of a high breakdown voltage device according to various embodiments of the present disclosure.

FIG. 6 is a top view of a high breakdown voltage device 600 according to various embodiments of the present disclosure. The high breakdown voltage device 600 of FIG. 6 includes 6 high breakdown voltage transistors 601, 603, 605, 607, 609, and 611. Some of the high breakdown voltage transistors have the same pie slice size, so that the driving current may be the same, for example, 601 and 603 are approximately a same size. Some of the high breakdown voltage transistors have different sizes, so that the driving currents are different, for example, 601 and 611. By selecting a different number of high breakdown voltage transistors at any one time to achieve a driving current. A circuit designer may design a device 600 such that all foreseeable driving current specifications may be achieved using one design. Such design would reduce manufacturing variability and increase design efficiency.

Figure 7:
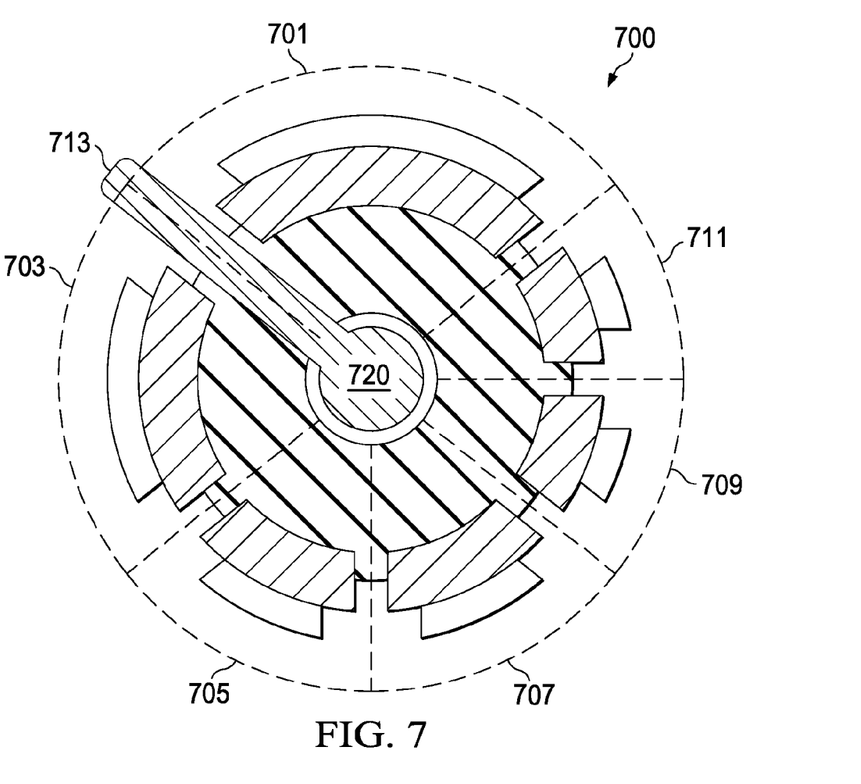

FIG. 7 is a top view of a high breakdown voltage device 700 according to various embodiments of the present disclosure. The high breakdown voltage device 700 of FIG. 7 includes 6 high breakdown voltage transistors 701, 703, 705, 707, 709, and 711. The device 700 differs from device 600 of FIG. 6 in that the drain is conducted horizontally through one of the openings between adjacent high breakdown voltage transistors. As shown, the drain 720 is conducted through drain conductor 713 between high breakdown voltage transistors 701 and 703. The horizontal drain conduction adds flexibility in layout by having contacts in the residual space between adjacent high breakdown voltage devices. Because the high breakdown voltage devices are substantially round, they cannot be packed as tight as rectangular transistors, often leaving valuable silicon real estate unused between three or four high breakdown voltage devices. By horizontal routing for some of the transistor connections, the complexity in the metal layer above may be reduced.

Figure 8:
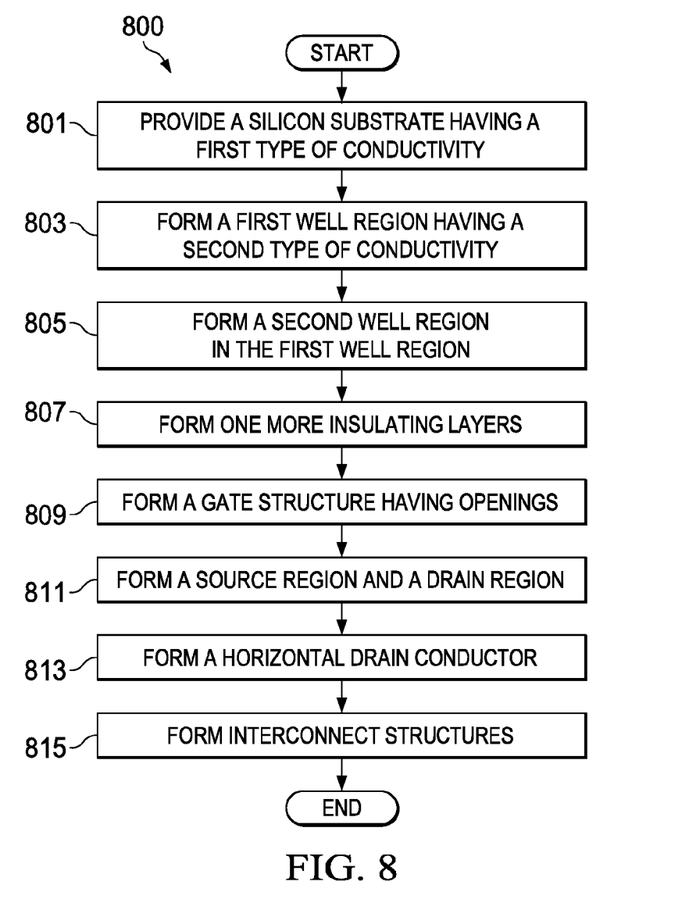
FIG. 8 is a flow chart of a method for fabricating a high breakdown voltage device according to various aspects of the present disclosure.

FIG. 8 is a flow chart of a method 800 for fabricating a high breakdown voltage device according to various aspects of the present disclosure. As discussed, the high breakdown voltage device may be formed using the similar process, with different feature layouts, as conventional high breakdown voltage transistors. The process is summarized herein to add context for the device, structure, and method of using the device while highlighting the differences.

In operation 801, a substrate having a first type of conductivity is provided. In the present embodiment, the high breakdown voltage device includes n-type high breakdown voltage transistors, and thus, the substrate includes a p-type silicon substrate (p-substrate). The substrate be a semiconductor wafer, such as a silicon wafer. Alternatively, the substrate may include other elementary semiconductors, such as germanium. The substrate may also include a compound semiconductor, such as silicon carbide, gallium arsenic, indium arsenide, and indium phosphide. The substrate may include an alloy semiconductor, such as silicon germanium, silicon germanium carbide, gallium arsenic phosphide, and gallium indium phosphide.

In operation 803, a first well is formed over the substrate, the first well having a different type of conductivity from the substrate. For example, the substrate has a p-type conductivity and the first well has an n-type conductivity. In some embodiments, the first well is a deep n-well formed over the p-substrate by an epitaxial process using a dopant. In other embodiments, the first well is formed by implanting the substrate with a dopant having an opposite conductivity as the substrate dopant, for example, an n-type dopant such as phosphorus.

In operation 805, a second well is formed in the first well, the second well having the same type of conductivity as the substrate. The second well may be referred as a p-well or P-body. The second well may have different portions, each portion having a different location and depth in the first well from the other portions. One, two, or three portions may be formed in separate doping processes. In some embodiments, the second well may be formed by a plurality of processing steps, whether now known or to be developed, such as growing a sacrificial oxide on the substrate, opening a pattern for the location(s) of the second well and implanting the impurities. No implantation would occur in the p-well discontinuities of the present disclosure. The region above the p-well discontinuities may be covered by a sacrificial oxide or photoresist or selective implantation may be performed where dopant beams are directed only at selected locations in the substrate.

In operation 807, one or more insulating structures are formed. A first insulating structure separates the gate structure from the drain structure. An optional second field insulating structure separates the high breakdown voltage device from another high breakdown voltage device. The insulating structures are grown from the silicon substrate as an field oxide by exposing a hot substrate (above 500 degrees Celsius) to oxygen and oxygen-containing gas or vapor. This formation process produces an insulating structure that is less dense that the silicon material it consumes. Because a portion of the silicon substrate material is consumed, the insulating layer is embedded and surrounded by unreacted silicon substrate material, with a portion protruding because the insulating structure has a lower density.

In operation 809, gate structures having openings are formed. The gate structure has a dielectric layer close to the first insulating structure. The gate structure may overlie different areas: a first part of the gate structure overlies a portion of the first insulating layer, a second part of the gate structure may overlie a top surface portion of the first well, and a third part of the gate structure overlies a portion of the second well. The precise overlay of the gate structure to the three areas are achieved by a process including photolithography patterning and etching. One method for patterning the gate dielectric and electrode layers over the three areas is described below. A layer of polysilicon electrode material is first deposited. A layer of photoresist and optionally a hardmask layer are formed on the polysilicon electrode layer by a suitable process, such as spin-on coating and chemical vapor deposition, and then patterned to form a patterned photoresist feature by a lithography patterning method. The patterned photoresist layer is formed on the hard mask layer. The pattern of the photoresist layer includes the gate structure openings and is transferred to the hard mask layer and then transferred to the polysilicon layer to form the gate electrode. The hard mask layer may include silicon nitride, silicon oxynitride, silicon carbide, and/or other suitable dielectric materials, and may be formed using a method such as CVD or PVD. The pattern of the photoresist can then be transferred by a dry etching process to the underlying polysilicon layer and the gate dielectric layer to form gate electrodes and gate dielectric, in a plurality of processing steps and various proper sequences. The overlay of the gate structure to the first insulating structure, the first well, and the second well is controlled by the lithographic alignment procedure. The photoresist layer is stripped thereafter. In some embodiments, the second well adjoins the first insulating layer and the second overlying portion of the gate structure described above does not exist.

In operation 811, a source region and a drain region are formed. A first source region may have the first type of conductivity; a second source region, formed next to the first source region, may have the second type of conductivity. For example, the first part source is p-type, and the second part source is n-type or vice versa. The drain region may be n-type. The first and second source and drain regions are formed by implanting n-type or p-type or both types of dopants in each of the regions. Portions may be implanted at the same time. In one example, the drain region and the first doped source region are implanted at the same time; and the second doped source regions is implanted separately. In another example, all of the regions are implanted using one type of dopant and only one region is implanted using another type of dopant. In still other examples, the regions are implanted at different times.

In optional operation 813, a horizontal drain conductor is formed. The horizontal drain conductor is shown as element 713 in FIG. 7 and is used instead of a drain contact on the drain region. The horizontal drain conductor connects the drain region to an electrode pad outside of the circular area. The horizontal drain conductor may be formed by depositing a conductor over the first insulating structure and gate structure and patterning the conductor to remove conducting material not in the pattern. The gate structure may be protected first by a protective layer or photoresist material before depositing the conductor. In some embodiments, the horizontal drain conductor is deposited by an electroplating method or a physical vapor deposition method. The horizontal drain conductor may also be formed by first shaping the first insulating structure between the drain region and the gate structure opening, for example, by etching. The conductor is then deposited in the resulting trench and the horizontal drain conductor would be embedded in the first insulating structure.

In operation 815, interconnect structures are formed. The interconnect structures may include various contacts, such as gate contacts, source contacts and drain contacts, as well as the metal layers above them to connect the contacts to power, selector, and buses. One or many contacts may be used along the circular section of source region and gate structure. In some embodiments, several contacts are formed on the drain structure for one high breakdown voltage transistor and linked together on a metal layer to ensure adequate electrical contact between the overlying metal layer and the structure below. An interlayer dielectric (ILD) fills the space between the various contacts. In some embodiments, the interconnect structure connects to monitoring devices such as a current meter or voltage meter. A monitoring device may include circuit logic that substitutes one or more high breakdown voltage transistor when a monitored value, for example, on-current, deviates from an expected value by a certain amount. Such monitoring device and circuit improve reliability of the overall product.

The interconnect structure and contacts are formed of conductive materials, such as aluminum, aluminum/silicon/copper alloy, titanium, titanium nitride, tungsten, polysilicon, metal silicide, or combinations thereof, being referred to as aluminum interconnects. Aluminum interconnects may be formed by a process including physical vapor deposition (or sputtering), chemical vapor deposition (CVD), or combinations thereof. Other manufacturing techniques to form the aluminum interconnect may include photolithography processing and etching to pattern the conductive materials for vertical connection (via and contact) and horizontal connection (conductive line). Alternatively, a copper multilayer interconnect may be used to form the metal patterns. The copper interconnect structure may include copper, copper alloy, titanium, titanium nitride, tantalum, tantalum nitride, tungsten, polysilicon, metal silicide, or combinations thereof. The copper interconnect may be formed by a technique including CVD, sputtering, plating, or other suitable processes.

The ILD material includes silicon oxide. Alternatively or additionally, the ILD includes a material having a low dielectric constant, such as a dielectric constant less than about 3.5. In one embodiment, the dielectric layer includes silicon dioxide, silicon nitride, silicon oxynitride, polyimide, spin-on glass (SOG), fluoride-doped silicate glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other suitable materials. The dielectric layer may be formed by a technique including spin-on, CVD, or other suitable processes.

The contacts and interconnects are usually metal formed in an integrated process such as a damascene process. In a damascene process, a metal such as copper is used as conductive material for interconnection. Another metal or metal alloy may be additionally or alternatively used for various conductive features. Accordingly, silicon oxide, fluorinated silica glass, or low dielectric constant (k) materials can be used for ILD. During the damascene process, a trench is formed in a dielectric layer, and copper is filled in the trench. Chemical mechanical polishing (CMP) technique is implemented afterward to etch back and planarize the substrate surface.

An integrated chip including the high breakdown voltage device may include many interconnect levels having vias, metal layers, and ILDs. The material and method of deposition between successive interconnect levels may change. The integrated chip includes other semiconductor devices such as low voltage transistors, capacitors, resistors, and inductors. The various semiconductor devices are combined to perform functions such as logic, memory, signal processing, power management, and the like. The integrated chip may be a system on a chip or a function-specific chip. The integrated chip may include two or more substrates combined in a stack.

Figure 9:
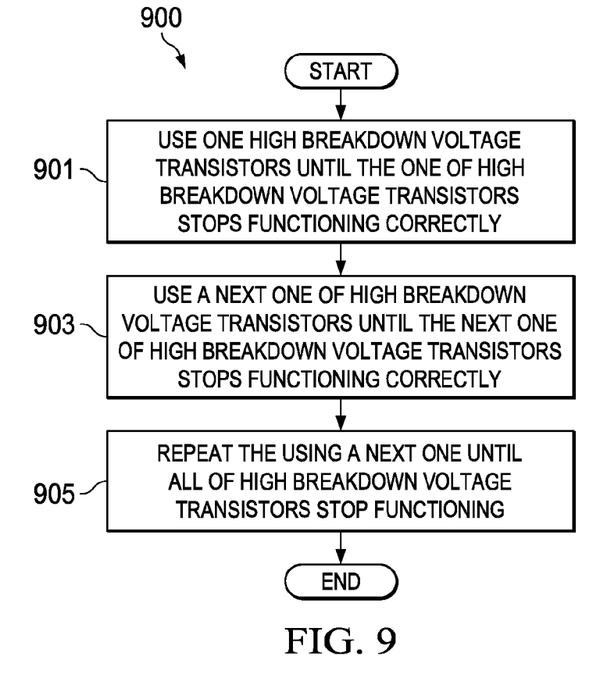
FIGS. 9 and 10 are flow charts of methods for using a high breakdown voltage device according to various aspects of the present disclosure.

The high breakdown voltage devices in accordance with various embodiments of the present disclosure may be used in a variety of integrated chips to perform a variety of functions. FIG. 9 is a flow chart of a method 900 for using a high breakdown voltage device according to various aspects of the present disclosure. As discussed, the high breakdown voltage device may be used to extend the lifetime and reliability of high breakdown voltage transistors. In other words, the high breakdown voltage device is used to build redundancy into the circular high breakdown voltage transistors. In the example of FIG. 9, a high breakdown voltage device is used to replace one or more circular high breakdown voltage transistors. In operation 901, one high breakdown voltage transistor in a high breakdown voltage device is used until the one high breakdown voltage transistor stops functioning correctly. For the circular high breakdown voltage transistor, once it stops functioning correctly, without redundancy, the correct functioning of entire integrated chip may be affected. However, in the example as shown in operation 903, a next one of high breakdown voltage transistor is used until the next one of high breakdown voltage transistor stop functioning correctly. The life of the integrated chip is extended thus by at least a lifetime of a high breakdown voltage transistor. In one example, a selector would select the next gate to turn on if the first high breakdown voltage transistor fails a test, for example, by conducting between the source and drain without a gate voltage. In operation 903, the process may be repeated until all of the high breakdown voltage transistors stop functioning correctly. As discussed, the circular high breakdown voltage transistor is usually designed for a higher driving current then used during operation and a separate resistor is used in a control circuit to lower the current. Thus in many cases the use of high breakdown voltage device allows reducing of the high breakdown voltage transistor area while maintaining performance requirements. The surplus area is used for redundancy with separate high breakdown voltage transistors in the same high breakdown voltage device.

Figure 10:
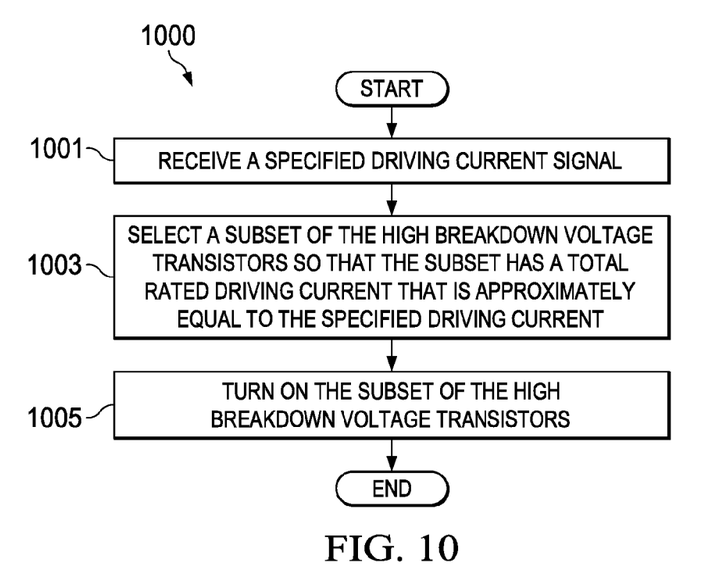

In other embodiments, the high breakdown voltage devices in accordance with various embodiments of the present disclosure in a method 1000 according to FIG. 10. The high breakdown voltage device may be used to generate different driving currents by turning on different combinations of high breakdown voltage transistors. In some embodiments, the device may receive a specified driving current signal in operation 1001. The signal may be in a number of different formats or may be a numerical signal. In operation 1003, a subset of the high breakdown voltage transistors in the high breakdown voltage device is selected so that the total rated driving current is approximately equal to the specified driving current according to the signal. The approximation may be predefined by the designer by sizing of the smallest high breakdown voltage transistor. Then in operation 1005, the subset of the high breakdown voltage transistors are turned on to generate the specified driving current. In one example where the circular high breakdown voltage transistor has a 30 mA driving current, the replacement high breakdown voltage device may have two 20 mA high breakdown voltage transistors, one 5 mA high breakdown voltage transistor, and four or five 1 mA high breakdown voltage transistors. This specific combination allows the high breakdown voltage device to generate a driving current having any whole number of mAs. In another example, a combination of 8 mA, 7 mA, 5 mA, 3 mA, 2 mA, 1 mA, 0.5 mA, 0.3 mA, 0.1 mA, and 0.1 mA high breakdown voltage transistors can drive a current between 0.1 mA to 27 mA in 0.1 mA increments. One skilled in the art would be able to select a combination that best suits possible driving current during operation while building in redundancy. Because the high breakdown voltage device of the present disclosure includes gate structure openings and hence channel width discontinuities, not all of the silicon area in a high breakdown voltage device is utilized. A small pie slice corresponding to the gate structure openings is not used to drive current. As the number of high breakdown voltage transistors in a high breakdown voltage device increases, the unused real estate also increases. However, because the gate structure opening size is only limited by minimum spacing rule for the technology node, the size may be small relative to the high breakdown voltage device, and represents no more than one or two percent of total area.

According to various embodiments, the present disclosure provides a high voltage semiconductor device that includes a number of high breakdown voltage transistors sharing a drain region, a first doped well, and a first insulating structure, wherein each of the high breakdown voltage transistors has a pie slice shape in a top view and the high breakdown voltage transistors together has a circular shape.

Among various embodiments, the present disclosure provides an enhanced performing high voltage device having a lightly doped semiconductor substrate having a first type of conductivity, a first well region having the second type of conductivity and formed over the lightly doped semiconductor substrate, a second well region in the first well region and having the first type of conductivity, an elliptical ring-shaped first insulating structure over and partially embedded in the first well region, a gate structure partially over the first insulating structure and partially over the second well region, a drain region in the center of the first well region across the first insulating structure from the gate structure, a source region in the second well region disposed on a side of the gate structure opposite from the drain region. The second well region and the source region are discontinuous elliptical rings having at least two discontinuities in a top view. The gate structure is a discontinuous elliptical ring having at least two openings in a top view. The openings and discontinuities defines edges of different high breakdown voltage transistors. Each gate structure opening has congruent second well and source region discontinuities.

In another aspect, the present disclosure provides a method of using a high voltage semiconductor device that includes a plurality of high breakdown voltage transistors sharing a drain region and a first dielectric structure. The method includes selectively turning on a subset of the plurality of high breakdown voltage transistors based on a specified driving current and/or a functioning status of each of the plurality of high breakdown voltage transistors. The method may also include using one of the plurality of high breakdown voltage transistors until the one of the plurality of high breakdown voltage transistor stops functioning correctly and using a next one of the plurality of high breakdown voltage transistors until the next one of the plurality of high breakdown voltage transistor stops functioning correctly. In some embodiments, the method includes selecting a subset of the plurality of high breakdown voltage transistors wherein the subset has a total rated driving current that is approximately equal to the specified driving current.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of using a high voltage semiconductor device that includes a plurality of high breakdown voltage transistors sharing a drain region and a first dielectric structure, the method comprising performing step (a), step (b) or both step (a) and step (b), wherein:
    step (a) comprises selectively turning on a subset of the plurality of high breakdown voltage transistors so that a collective driving current of the subset equals a predetermined driving current and step (b) comprises selectively turning on a subset of the plurality of high breakdown voltage transistors to maintain a pre-determined current value.

2. The method of claim 1, wherein the selectively turning on comprises:
    using one of the plurality of high breakdown voltage transistors until the one of the plurality of high breakdown voltage transistor stops functioning correctly; and
    using a next one of the plurality of high breakdown voltage transistors until the next one of the plurality of high breakdown voltage transistor stops functioning correctly.

3. The method of claim 2, further comprising:
    repeating the using a next one until all of the plurality of high breakdown voltage transistors stop functioning correctly.

4. The method of claim 2, further comprising monitoring performance of the high breakdown voltage transistors.

5. The method of claim 4, wherein monitoring performance of the high breakdown voltage transistors includes determining when on-current for a high breakdown voltage transistor deviates from an expected value by a predetermined amount.

6. The method of claim 4, wherein monitoring performance of the high breakdown voltage transistors includes determining when on-current for a high breakdown voltage transistor deviates from a historical value by a predetermined amount.

7. The method of claim 1, wherein the selectively turning on comprises:
    selecting a subset of the plurality of high breakdown voltage transistors wherein the subset has a total rated driving current that is approximately equal to the specified driving current.

8. The method of claim 1, wherein the plurality of high breakdown voltage transistors includes high breakdown voltage transistors having different rated driving currents.

9. A method of using a plurality of high breakdown voltage transistors sharing a drain region and a first dielectric structure, wherein at least one of the breakdown voltage transistors has a first individual driving current and at least one other of the breakdown voltage transistor has a second individual driving current different than the first individual driving current, the method comprising:
    determining a specified driving current;
    selecting for operation a sub-set of the plurality of breakdown voltage transistors that collectively provide individual driving currents that approximately equal the specified driving current; and
    operating the sub-set of the plurality of breakdown voltage transistors to provide the specified driving current.

10. The method of claim 9, further comprising monitoring performance of the sub-set of the plurality of breakdown voltage transistors.

11. The method of claim 10, wherein the step of monitoring performance of the sub-set of the plurality of breakdown voltage transistors includes monitoring on-current values of individual ones of the sub-set of the plurality of breakdown voltage transistors and comparing the on-current values to an expected value.

12. The method of claim 11, further comprising ceasing to operate an undesirable breakdown voltage transistor when its on-current deviates from the expected value by a predetermined amount and operating a different breakdown voltage transistor in lieu of the undesirable breakdown voltage transistor.

13. The method of claim 12, wherein the step of ceasing to operate an undesirable breakdown voltage transistor when its on-current deviates from the expected value by a predetermined amount and operating a different breakdown voltage transistor in lieu of the undesirable breakdown voltage transistor is repeated until all of the plurality of breakdown voltage transistor cease operating.

14. The method of claim 10, wherein the step of monitoring performance of the sub-set of the plurality of breakdown voltage transistors includes monitoring on-current values of individual ones of the sub-set of the plurality of breakdown voltage transistors and comparing the on-current values to a historical value.

15. The method of claim 14, further comprising ceasing to operate an undesirable breakdown voltage transistor when its on-current deviates from the historical value by a predetermined amount and operating a different breakdown voltage transistor in lieu of the undesirable breakdown voltage transistor.

16. The method of claim 15, wherein the step of ceasing to operate an undesirable breakdown voltage transistor when its on-current deviates from the historical value by a predetermined amount and operating a different breakdown voltage transistor in lieu of the undesirable breakdown voltage transistor is repeated until all of the plurality of breakdown voltage transistor cease operating.

17. The method of claim 10, further comprising using a current meter to monitor on-current values of individual ones of the sub-set of the plurality of breakdown voltage transistors.

18. A method of operating a plurality of high breakdown voltage transistors, the plurality of high breakdown voltage transistors being arranged in an circular shape and sharing a common drain at the center of the circle, and sharing a common dielectric structure over which individual gates of the respective high breakdown voltage transistors lie, the method comprising:
 determining a desired performance parameter;
 selecting a subset of the plurality of high breakdown voltage transistors to meet the desired performance parameter; and
 turning on the selected subset of the plurality of high breakdown voltage transistors to meet the desired performance parameter.

19. The method of claim 18, wherein the desired performance parameter is a total driving current and wherein respective ones of the plurality of high breakdown voltage transistors contribute unequally to the total driving current.

20. The method of claim 18, further comprising:
 monitoring the performance of an individual one of the plurality of high breakdown voltage transistors; and
 operating an alternate one of the plurality of high breakdown voltage transistors in lieu of the individual one of the plurality of high breakdown voltage transistors when the performance of the individual one of the plurality of high breakdown voltage transistors deviates from a reference value by a predetermined amount.

\* \* \* \* \*